United States Patent
Park

(10) Patent No.: US 8,198,624 B2
(45) Date of Patent: Jun. 12, 2012

(54) ORGANIC LIGHT EMITTING DEVICE

(75) Inventor: Chonghyun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 75 days.

(21) Appl. No.: 12/376,050

(22) PCT Filed: Aug. 3, 2007

(86) PCT No.: PCT/KR2007/003747
§ 371 (c)(1),
(2), (4) Date: Feb. 2, 2009

(87) PCT Pub. No.: WO2008/016279
PCT Pub. Date: Feb. 7, 2008

(65) Prior Publication Data
US 2009/0267059 A1    Oct. 29, 2009

(30) Foreign Application Priority Data
Aug. 3, 2006    (KR) .................. 10-2006-0073525

(51) Int. Cl.
*H01L 51/52* (2006.01)
(52) U.S. Cl. ............ 257/40; 257/E51.022; 257/642; 257/643; 257/759; 257/E51.001; 257/E51.052; 257/E25.008
(58) Field of Classification Search ............ 257/40, 257/E51.022, 642, 643, E51.001, E51.052, 257/E25.008; 438/183
See application file for complete search history.

(56) References Cited

U.S. PATENT DOCUMENTS

| 6,784,459 | B2 | 8/2004 | Seki et al. | |
| 7,183,708 | B2* | 2/2007 | Baik et al. | 313/504 |
| 2004/0104197 | A1* | 6/2004 | Shigemura et al. | 216/20 |
| 2004/0124781 | A1 | 7/2004 | Bae et al. | |
| 2004/0212759 | A1* | 10/2004 | Hayashi | 349/84 |
| 2005/0140274 | A1 | 6/2005 | Lee et al. | |
| 2005/0168138 | A1* | 8/2005 | Okunaka et al. | 313/504 |
| 2005/0179377 | A1* | 8/2005 | Shitagami et al. | 313/512 |
| 2006/0055318 | A1* | 3/2006 | Baik et al. | 313/504 |
| 2006/0275967 | A1* | 12/2006 | Kang et al. | 438/183 |

FOREIGN PATENT DOCUMENTS

| CN | 1514679 A | 7/2004 |
| KR | 10-2005-0007902 A | 1/2005 |

* cited by examiner

*Primary Examiner* — Marc Armand
(74) *Attorney, Agent, or Firm* — Birch, Stewart, Kolasch & Birch, LLP

(57) ABSTRACT

An organic light emitting device is disclosed. The organic light emitting device includes a substrate, a display positioned on the substrate, and a dummy pattern positioned at an edge of the display. The display includes a plurality of sub-pixels each including a first electrode, an emissive unit including at least an organic emissive layer, and a second electrode. The dummy pattern includes a dummy layer including the same formation material as that of at least one of a plurality of layers for forming the emissive unit.

10 Claims, 5 Drawing Sheets

[Fig. 1]
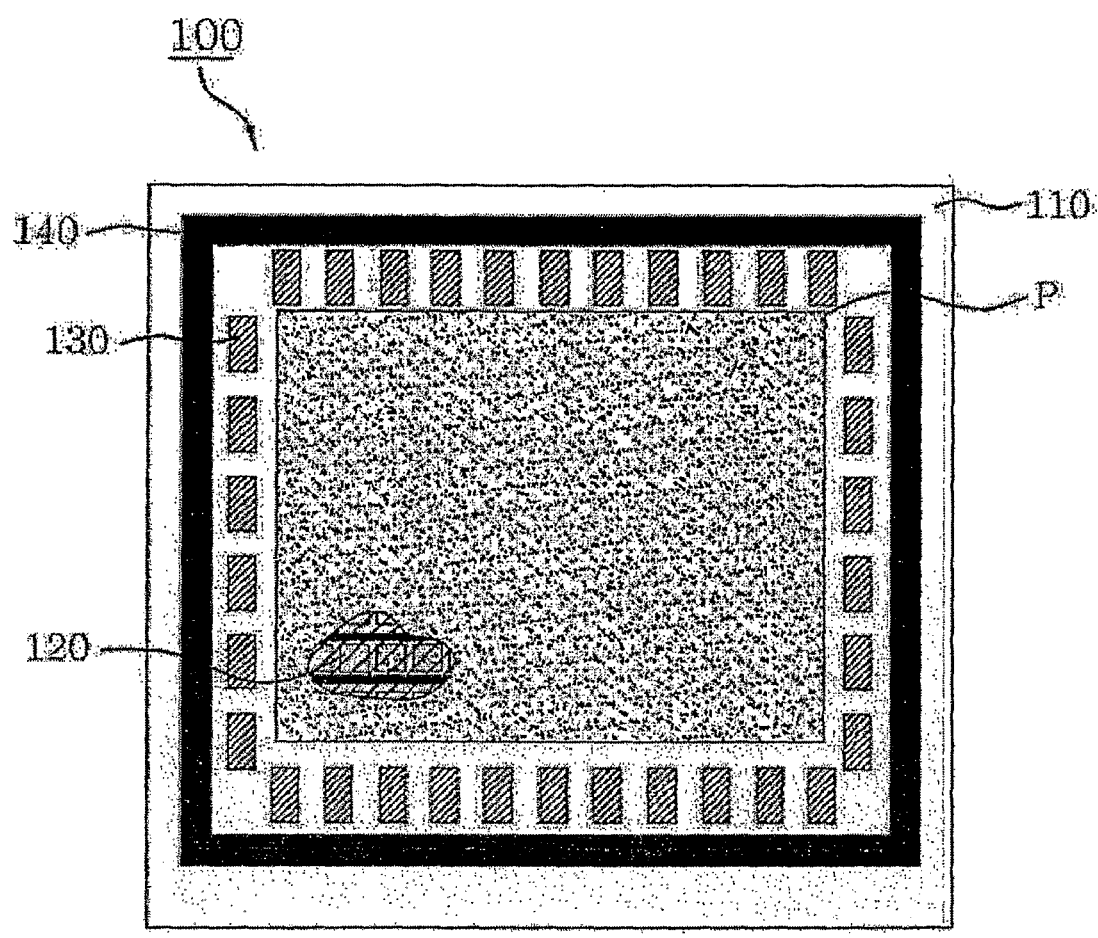
[Fig. 2]
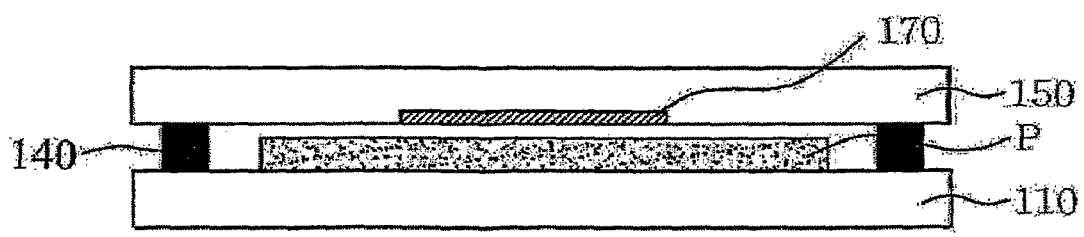

[Fig. 3]
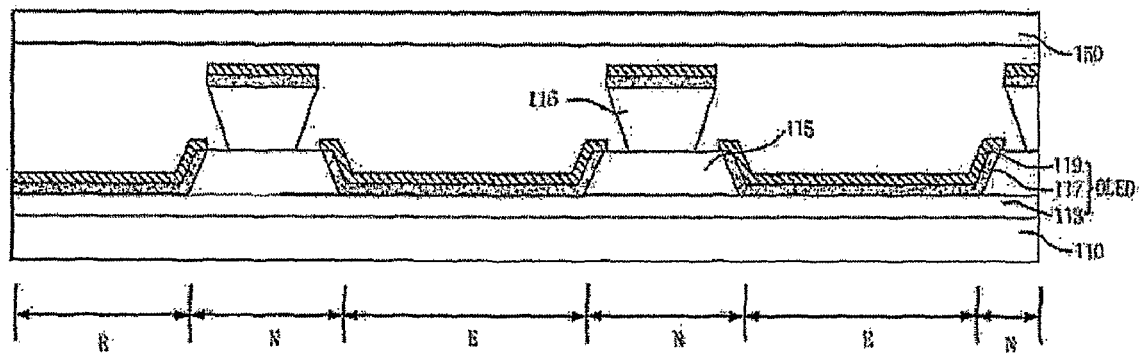
[Fig. 4]
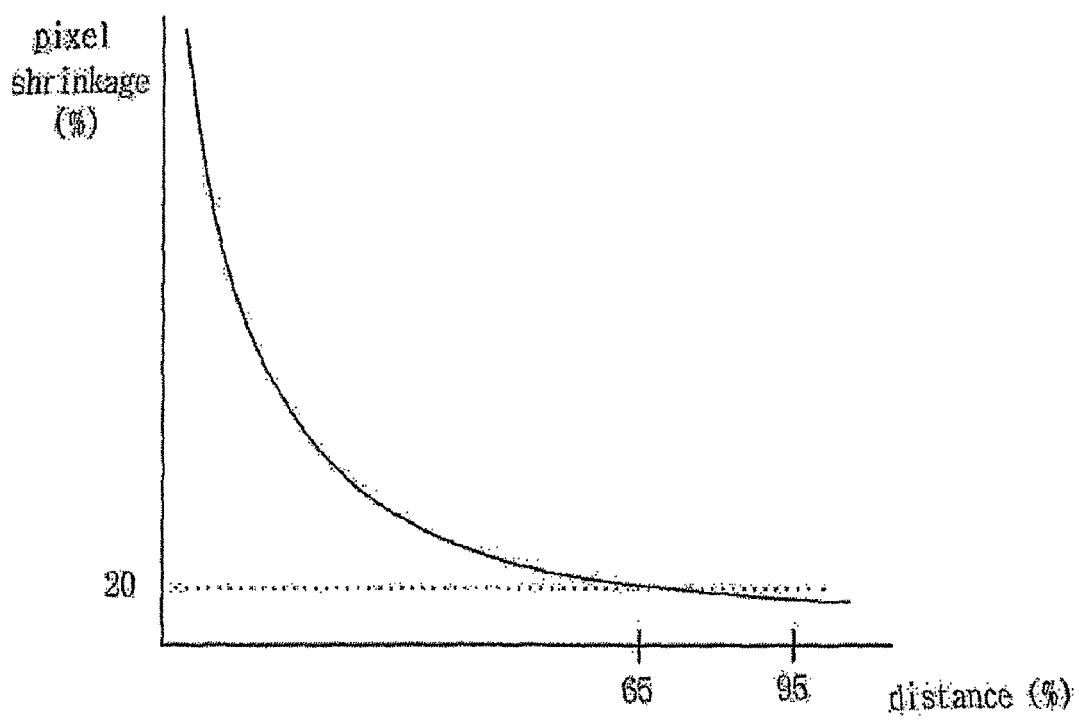

[Fig. 5]
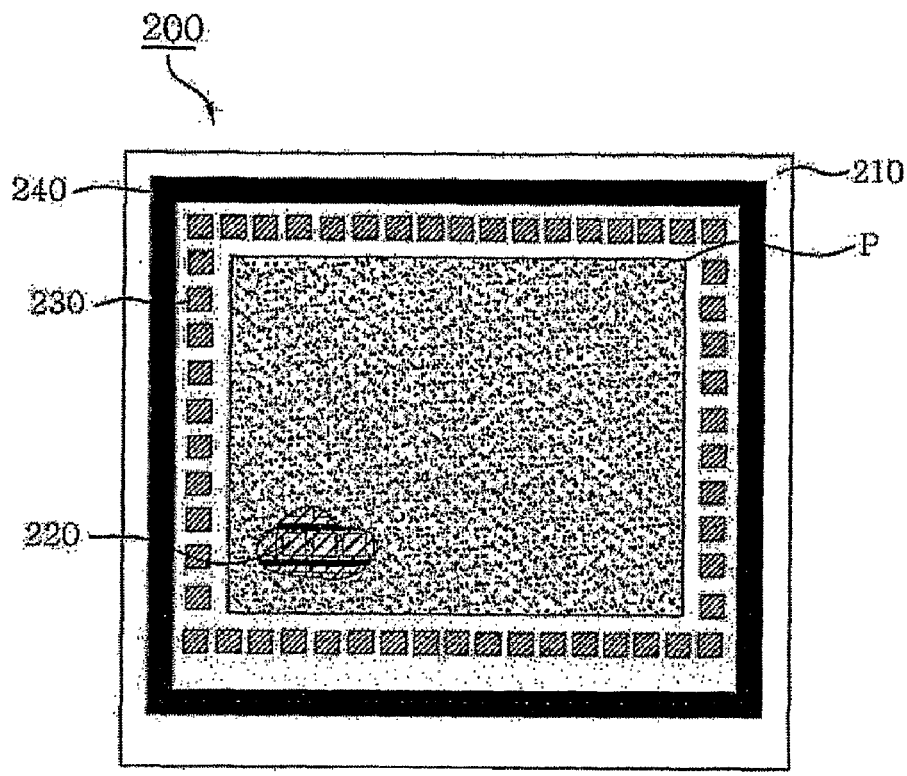
[Fig. 6]
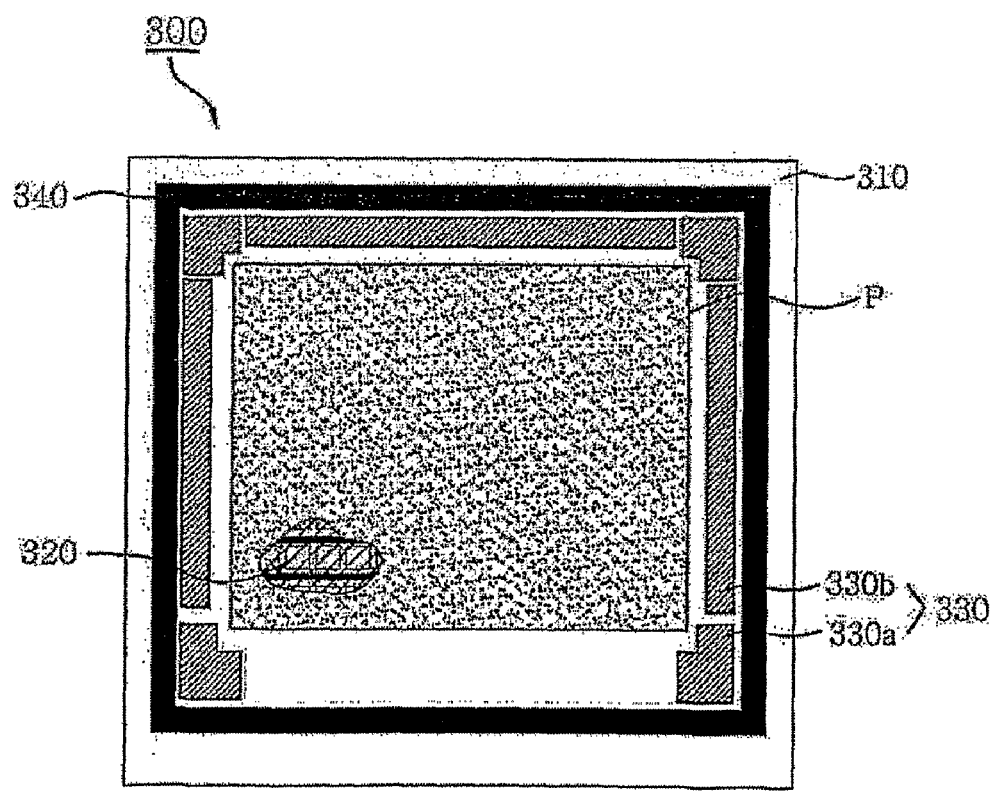

[Fig. 7]
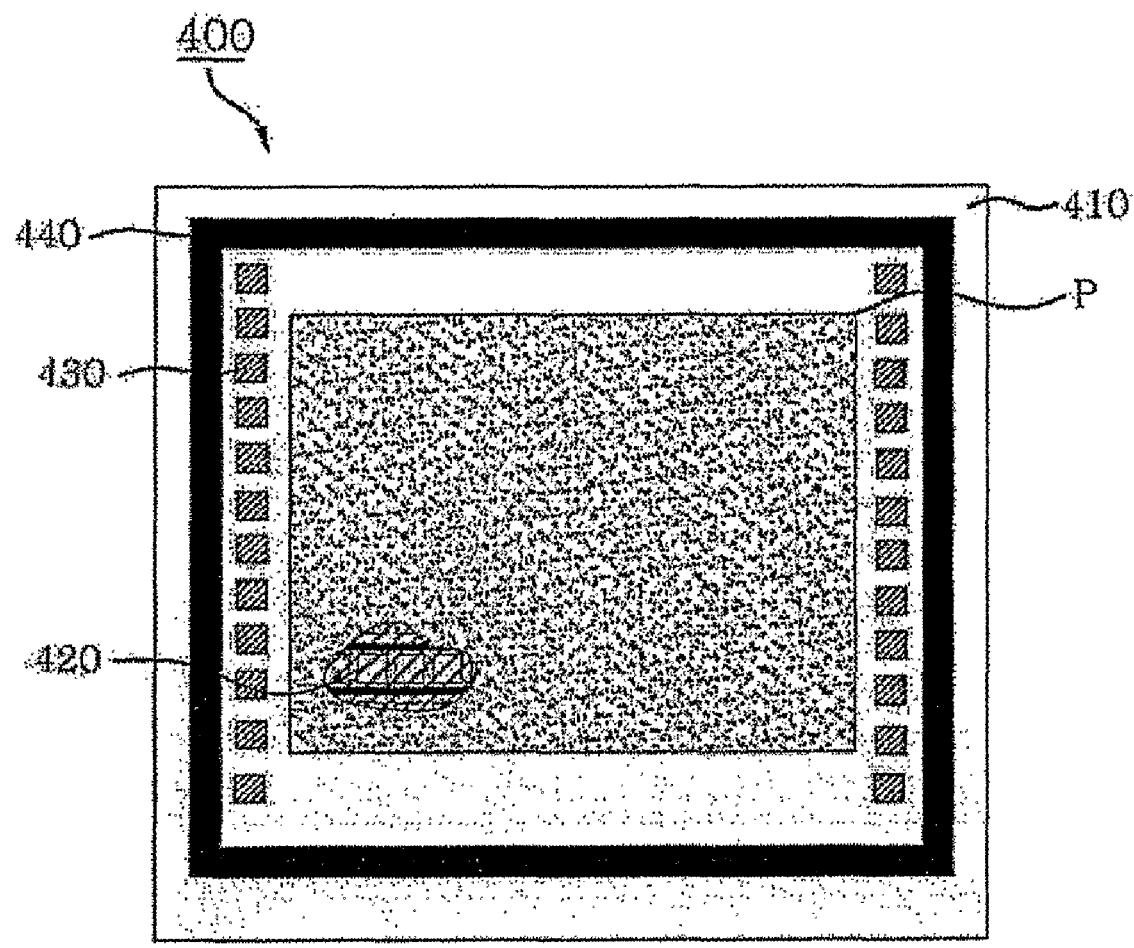

ORGANIC LIGHT EMITTING DEVICE

TECHNICAL FIELD

Exemplary embodiments relate to an organic light emitting device.

BACKGROUND ART

The importance of flat panel displays has recently increased with the growth of multimedia. Various types of flat panel displays such as liquid crystal displays (LCDs), plasma display panels (PDPs), field emission displays (FEDs), organic light emitting devices have been put to practical use.

The organic light emitting device has rapid response time, low power consumption, and self-emission structure. Furthermore, the organic light emitting device has a wide viewing angle, so that it can excellently display a moving picture regardless of the size of the screen or the position of a viewer.

Because the organic light emitting device may be fabricated in low temperature environment using a semiconductor fabrication process, the organic light emitting device has a simple fabrication process. Hence, the organic light emitting device is attractive as a next generation display device.

Generally, the organic light emitting device has N M organic light emitting diodes arranged in a matrix format and may be voltage-driven or current-driven, thereby displaying a predetermined image. The organic light emitting device includes a passive matrix type driving method and an active matrix type driving method using a thin film transistor.

DISCLOSURE OF INVENTION

Technical Problem

The organic light emitting device includes a plurality of organic light emitting diodes each having two electrodes and an organic emissive layer positioned between the two electrodes. Because the organic emissive layer is weak in moisture, the organic light emitting device is degraded easily.

Accordingly, a moisture absorbent for absorbing moisture penetrating the organic light emitting device from the outside of the organic light emitting device may be positioned inside the organic light emitting device.

However, because a large amount of moisture absorbent is necessary to sufficiently absorb moisture penetrating from the outside, the organic light emitting layer may be damaged and a pixel shrinkage phenomenon in which an emitting area of the organic light emitting layer is reduced may be caused.

Furthermore, in case that a pressure from outside is applied to the organic light emitting device, the organic light emitting diode contacts the moisture absorbent. This causes damage to the organic light emitting device. Accordingly, dark spots or line fail may be produced on the screen of the organic light emitting device, and thus the quality and life span of the organic light emitting device are reduced.

Technical Solution

In one aspect, an organic light emitting device comprises a substrate, a display that is positioned on the substrate and includes a plurality of subpixels each including a first electrode, an emissive unit including at least an organic emissive layer, and a second electrode, and a dummy pattern that is positioned at an edge of the display, and includes a dummy layer including the same formation material as that of at least one of a plurality of layers for forming the emissive unit.

Advantageous Effects

Since the organic light emitting device according to an exemplary embodiment includes the dummy pattern outside the display, the dummy pattern can absorb moisture or oxygen penetrating the organic light emitting device from the outside of the organic light emitting device. Accordingly, the degradation of the organic light emitting device due to moisture or oxygen is prevented, and thus the quality and life span of the organic light emitting device can be improved.

BRIEF DESCRIPTION OF THE DRAWINGS

The accompanying drawings, which are comprised to provide a further understanding of the invention and are incorporated in and constitute a part of this specification, illustrate embodiments of the invention and together with the description serve to explain the principles of the invention. In the drawings:

FIG. 1 is a plane view of an organic light emitting device according to an exemplary embodiment;

FIG. 2 is a cross-sectional view of the organic light emitting device of FIG. 1A;

FIG. 3 is a cross-sectional view of a subpixel of an organic light emitting device according to an exemplary embodiment;

FIG. 4 is a graph showing a relationship between pixel shrinkage and a location of a dummy pattern;

FIG. 5 is a plane view of an organic light emitting device according to a modified exemplary embodiment;

FIG. 6 is a plane view of an organic light emitting device according to another modified exemplary embodiment;

FIG. 7 is a plane view of an organic light emitting device according to another modified exemplary embodiment.

BEST MODE FOR CARRYING OUT THE INVENTION

Figure 8:
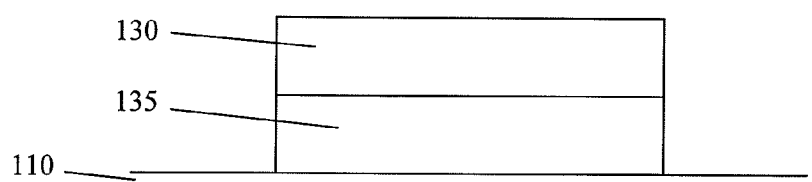
FIG. 8 is a cross section view of the dummy pattern having an insulating layer.

Reference will now be made in detail embodiments of the invention examples of which are illustrated in the accompanying drawings.

FIG. 1 is a plane view of an organic light emitting device according to an exemplary embodiment. FIG. 2 is a cross-sectional view of the organic light emitting device of FIG. 1.

As illustrated in FIGS. 1 and 2, an organic light emitting device 100 according to an exemplary embodiment includes a first substrate 110, a display P positioned on the first substrate 100, a dummy pattern 130, a sealing area 140, and a second substrate 150.

The first substrate 110 may include a transparent material such as glass, a flexible material such as plastic, or a metal material.

The display P includes a plurality of subpixels 120, and each subpixel 120 includes a first electrode, an organic emissive unit, and a second electrode. Each subpixel 120 can emit red, green, blue or white light depending on a formation material of the organic emissive unit.

FIG. 3 is a cross-sectional view of a subpixel of an organic light emitting device according to an exemplary embodiment.

As illustrated in FIG. 3, a first electrode 113 is positioned on the first substrate 110. The first electrode 113 may be an anode electrode. The first electrode 113 may include a transparent conductive oxide layer such as an indium-tin-oxide (ITO) layer. A bank layer 115 is positioned on the first electrode 113 to provide electrical insulation between the first electrodes 113 and to define an emitting area. An area of the first electrode 113 exposed by the bank layer 115 is defined as an emitting area E. An area except the emitting area E from the first electrodes 113 is defined as a non-emitting area N.

A reverse taper-shaped barrier rib 116 is positioned on the bank layer 115, and an emissive unit 117 is positioned on the area (i.e., the emitting area E) of the first electrode 113 exposed by the bank layer 115. The emissive unit 117 includes an organic emissive layer, and at least one of a hole injecting layer, a hole transporting layer, an electron transporting layer and an electron injecting layer positioned on and under the organic emissive layer.

A second electrode 119 is positioned on the emissive unit 117. The second electrode 119 may be a cathode electrode. The second electrodes 119 are spaced apart from each other with the barrier rib 116 therebetween. The second electrode 119 may include a material having a low work function and excellent reflectivity such as aluminum (Al), magnesium (Mg), and silver (Ag).

The emissive unit 117 receives holes from the first electrode 115 and electrons from the second electrode 119 to form excitons. Then, the organic light emitting device displays an image due to light generated when the exciton returns to a ground level.

In an active matrix type organic light emitting device, each subpixel 120 may further include a thin film transistor electrically connected to the first electrode 113.

Referring to FIGS. 1 and 2, the dummy pattern 130 is positioned at an edge of the display P. The dummy pattern 130 may include a dummy layer containing an organic material or an inorganic material. The dummy layer may include any one of a plurality of layers for forming the emissive unit 117 of the subpixel 120. For instance, the dummy layer may include one of a hole injecting layer, a hole transporting layer, an organic emissive layer, an electron transporting layer, or an electron injecting layer.

The dummy pattern 130 may include a plurality of dummy layers. In other words, the dummy pattern 130 may include at least one of a hole injecting layer, a hole transporting layer, an organic emissive layer, an electron transporting layer, or an electron injecting layer. The dummy layer may include an organic material and an inorganic material.

Because the organic material or the inorganic material forming the dummy layer of the dummy pattern 130 may react with moisture or oxygen penetrating the organic light emitting device from the outside of the organic light emitting device, the dummy layer may absorb the moisture or oxygen due to a solid solution having a pre-determined solubility obtained by dissolving one or more solutes in a solvent.

Accordingly, since the dummy layer absorbs the moisture or oxygen existing in the organic light emitting device, deterioration of the organic emissive layer is prevented.

The dummy pattern 130 may further include a metal layer. More specifically, the metal layer may be positioned inside the dummy pattern 130, and include the same formation material as that of the second electrode on the dummy layer. In case that the metal layer is positioned on the dummy layer, the metal layer prevents the peeling of the dummy layer absorbing moisture or oxygen.

The dummy pattern 130 may further include an insulating layer 135 positioned under the dummy layer. The insulating layer 135 may include the same formation material as that of the bank layer 115 positioned on the first electrode 113 of the subpixel 120.

As above, the dummy pattern 130 including the dummy layer, the metal layer or the insulating layer may be formed using the same formation process as that of the subpixel 120. For instance, the dummy pattern 130 may be patterned to have various sizes and forms by forming an open area on a mask area corresponding to a location of the dummy pattern 130 when the organic emissive layer of the subpixel 120 is fabricated.

The metal layer of the dummy pattern 130 and the second electrode of the subpixel 120 may be formed simultaneously. The insulating layer of the dummy pattern 130 and the bank layer of the subpixel 120 may be formed simultaneously.

Because the dummy pattern 130 and the subpixel 120 are formed simultaneously, a separate process for forming the dummy pattern 130 is not necessary.

The sealing area 140 is positioned at an edge of the display P to be spaced apart from the dummy pattern 130 with a predetermined distance therebetween. A sealant is coated on the sealing area 140 to attach the first substrate 110 to the second substrate 150.

The second substrate 150 may be generally formed of a metal cap, a transparent or opaque glass substrate, or a protective film, and the like, however, an exemplary embodiment is not limited thereto. A moisture absorbent 170 for absorbing moisture and oxygen may be formed inside the second substrate 150.

The dummy pattern 130 may be positioned closer to the sealing area 140 than the display P. More specifically, the dummy pattern 130 may be positioned at a location corresponding to 65-95% of a distance ranging from the display P to the sealing area 140. When the dummy pattern 130 is positioned at a location corresponding to equal to or more than 65% of the distance, the dummy pattern 130 is close to the sealing area 140, thereby efficiently absorbing moisture or oxygen penetrating from the outside. Further, when the dummy pattern 130 is positioned at a location corresponding to equal to or less than 95% of the distance, the dummy layer of the dummy pattern 130 prevents a pollution of the sealing area 140, and an adhesive strength between the first substrate 110 and the second substrate 150 increases.

FIG. 4 is a graph showing a relationship between pixel shrinkage and a location of a dummy pattern.

As illustrated in FIG. 4, when the dummy pattern 130 is positioned at a location corresponding to 65-95% of the distance ranging from the display P to the sealing area 140, pixel shrinkage is maintained at a level of about 20%.

MODE FOR THE INVENTION

FIGS. 5 to 7 are plane views of organic light emitting devices according to modified exemplary embodiments.

As illustrated in FIG. 5, a dummy pattern 230 is formed using the same formation process as that of an emissive unit 220 formed on a substrate 210. The plurality of dummy patterns 230 having the same size or shape as that of the emissive unit 220 may be formed to surround a display P. The size of the dummy pattern 230 may be larger than the size of the emissive unit 220. As above, when the dummy pattern 230 is plural, the plurality of dummy patterns 230 can efficiently absorb moisture or oxygen penetrating a peripheral area of the display P.

As illustrated in FIG. 6, a dummy pattern 330 may include first and second dummy patterns 330a and 330b positioned between a display P and a sealing area 340 formed on a substrate 310. The first dummy pattern 330a is formed at each corner between the display P and the sealing area 340, and the second dummy pattern 330b is formed in a straight area between the display P and the sealing area 340. A width of the first dummy pattern 330*a* may be larger than a width of the second dummy pattern 330*b* because the amount of moisture or oxygen penetrating the corner between the display P and the sealing area 340 is more than the amount of moisture or oxygen penetrating the other areas.

As illustrated in FIG. 7, a dummy pattern 430 may be formed at one side or both sides of an area between a display P and a sealing area 440 not to affect formation of scan lines or data lines.

It will be apparent to those skilled in the art that various modifications and variations can be made in embodiments of the present invention. Thus, it is intended that embodiments of the present invention cover the modifications and variations of the embodiments described herein provided they come within the scope of the appended claims and their equivalents.

INDUSTRIAL APPLICABILITY

As above, since the organic light emitting device according to an exemplary embodiment includes the dummy pattern outside the display, the dummy pattern can absorb moisture or oxygen penetrating the organic light emitting device from the outside of the organic light emitting device.

Accordingly, the degradation of the organic light emitting device due to moisture or oxygen is prevented, and thus the quality and life span of the organic light emitting device can be improved. So the organic light emitting device to an exemplary embodiment has industrial applicability.

The invention claimed is:

1. An organic light emitting device comprising:
   a substrate;
   a display that is positioned on the substrate and includes a plurality of subpixels each including a first electrode, an emissive unit including at least an organic emissive layer, and a second electrode;
   dummy patterns that surround the subpixels, and include dummy layers including the same material as that of at least one of a plurality of layers for forming the emissive unit; and
   a sealing area that is positioned at edges of the display and the dummy patterns, and is coated with a sealant,
   wherein the dummy patterns are positioned between the display and the sealing area, and are positioned closer to the sealing area than the display,
   wherein the dummy patterns prevent the subpixels from moisture penetrating the sealing area by absorbing the moisture, and
   wherein each of the dummy patterns further includes a metal layer positioned on the dummy layer, and the metal layer includes the same formation material as that of the second electrode to prevent the peeling of the dummy layer absorbing the moisture.

2. The organic light emitting device of claim 1, wherein the emissive unit further includes one of a hole injecting layer, a hole transporting layer, an electron transporting layer or an electron injecting layer.

3. The organic light emitting device of claim 1, wherein each of the dummy layers includes a plurality of layer including at least one of an organic material or an inorganic material.

4. The organic light emitting device of claim 1, wherein the size of the dummy patterns is equal to or larger than the size of the subpixel.

5. The organic light emitting device of claim 1, wherein the dummy pattern is positioned at a location corresponding to 65-95% of a distance ranging from the display to the sealing area.

6. The organic light emitting device of claim 1, wherein the each of dummy patterns includes a first dummy patterns positioned at each corner between the display and the sealing area, and a second dummy patterns positioned in a straight area between the display and the sealing area.

7. The organic light emitting device of claim 1, wherein the subpixel further includes a bank layer that is positioned on the first electrode to expose a portion of the first electrode.

8. The organic light emitting device of claim 1, wherein the subpixel further includes a thin film transistor electrically connected to the first electrode.

9. The organic light emitting device of claim 6, wherein a width of the first dummy patterns are larger than a width of the second dummy patterns.

10. The organic light emitting device of claim 7, wherein each of the dummy patterns further includes an insulating layer positioned under the dummy layer, and the insulating layer includes the same formation material as that of the bank layer.

* * * * *